(12) United States Patent
Fuh

(10) Patent No.: US 6,307,767 B1
(45) Date of Patent: Oct. 23, 2001

(54) LOW POWER PRIORITY ENCODER

(75) Inventor: Horng-jyi Fuh, San Jose, CA (US)

(73) Assignee: Integrated Device Technology, Inc., Santa Clara, CA (US)

( * ) Notice: Subject to any disclaimer, the term of this patent is extended or adjusted under 35 U.S.C. 154(b) by 0 days.

(21) Appl. No.: 09/829,679

(22) Filed: Apr. 9, 2001

(51) Int. Cl.$^7$ ................................................. G11C 15/04
(52) U.S. Cl. ................ 365/49; 365/189.05; 365/189.07; 365/189.08; 365/230.08; 365/230.02
(58) Field of Search .................. 365/49, 189.07, 365/189.05, 189.08, 230.08, 230.02

(56) References Cited

U.S. PATENT DOCUMENTS

| | | | |
|---|---|---|---|
| 4,334,288 | 6/1982 | Booher | 710/121 |
| 5,619,446 | 4/1997 | Yoneda et al. | 365/49 |
| 5,754,463 | * 5/1998 | Henstrom et al. | 365/49 |
| 5,757,696 | * 5/1998 | Matsuo et al. | 365/185.07 |
| 6,005,790 | * 12/1999 | Chan et al. | 365/49 |
| 6,208,544 | * 3/2001 | Beadle et al. | 365/49 |

* cited by examiner

Primary Examiner—Andrew Q. Tran
(74) Attorney, Agent, or Firm—Bever, Hoffman & Harms, LLP

(57) ABSTRACT

A CAM system is provided that includes a plurality of CAM arrays that are assigned different priority levels. Each CAM array generates a plurality of match control signals, wherein each of the CAM arrays asserts a match control signal for each detected match. The CAM system also includes a plurality of latch circuits, each being coupled to receive the match control signals from a corresponding CAM array. A latch control circuit is also coupled to receive the match control signals from the CAM arrays. In response, the latch control circuit causes one and only one of the latch circuits to latch the match control signals received from the corresponding CAM array. The latch circuit that latches the match control signals is the latch circuit corresponding with the highest priority CAM array to assert a match control signal. In one embodiment, the latch circuit is controlled by a latch enable signal. Power savings are realized because only one latch enable signal is asserted for any compare operation. Further power savings are realized because only one of the latch circuits switches its stored match control signals during a compare operation.

13 Claims, 7 Drawing Sheets

LOW POWER PRIORITY ENCODER

BACKGROUND OF THE INVENTION

1. Field of the Invention

The present invention relates to a priority encoder for a content addressable memory (CAM) array.

2. Discussion of Related Art

CAM cells are defined as memory cells that are addressed in response to their content, rather than by a physical address within an array. FIG. 1 is a block diagram of a conventional memory array formed using twelve CAM cells. The CAM cells are labeled $M_{X,Y}$, where X is the row of the array, and Y is the column of the array. Thus, the array includes CAM cells $M_{0,0}$ to $M_{2,3}$. Each of the CAM cells is programmed to store a data bit value. In the described example, the data bit value stored in each CAM cell is indicated by either a "0" or a "1" in brackets. For example, CAM cells $M_{0,0}$, $M_{0,1}$, $M_{0,2}$ and $M_{0,3}$ store data bit values of 0, 1, 0 and 0, respectively. Each row of CAM cells is coupled to a common match line. For example, CAM cells $M_{0,0}$, $M_{0,1}$, $M_{0,2}$ and $M_{0,3}$ are coupled to match line $MATCH_0$.

The array of CAM cells is addressed by providing a data bit value to each column of CAM cells. Thus data bit values $D_0$, $D_1$, $D_2$ and $D_3$ are provided to columns 0, 1, 2 and 3, respectively. Note that complementary data bit values $D_0\#$, $D_1\#$, $D_2\#$ and $D_3\#$ are also provided to columns 0, 1, 2 and 3, respectively. If the data bit values stored in a row of the CAM cells match the applied data bit values $D_0$–$D_3$, then a match condition occurs. For example, if the data bit values $D_0$, $D_1$, $D_2$ and $D_3$ are 0, 1, 0 and 0, respectively, then the data bit values stored in the CAM cells of row 0 match the applied data bit values. Under these conditions, the $MATCH_0$ signal is asserted true (e.g., high). Because the applied data bit values $D_0$, $D_1$, $D_2$ and $D_3$ do not match the data bit values store in the CAM cells of rows 1 or 2, the $MATCH_1$ and $MATCH_2$ signals are de-asserted false (e.g., low). The match signals $MATCH_0$–$MATCH_2$ can be used for various purposes, such as implementing virtual addressing, in a manner known to those skilled in the art.

FIG. 2 is a block diagram of a conventional CAM System 1 that includes a 64 Kbit CAM array 10 and an associated priority encoder 11. CAM array 10 includes 1024 rows and 64 columns of CAM cells. A 64-bit data input signal D[63:0] is provided from an input/output (I/O) circuit (not shown) to CAM array 10. Each row of CAM cells in CAM array 10 simultaneously compares its contents with the input data signal D[63:0] in the manner described above in connection with FIG. 1. If a match is detected in any of the rows, CAM array 10 asserts a corresponding match control signal. More specifically, if a match is detected in row N of CAM array 10, then match control signal MATCH_N is asserted, where N is an integer between 0 and 1023.

More than one of the match control signals can be asserted during a comparison operation. For example, match control signals MATCH_1, MATCH_125 and MATCH_1000 may be asserted during the same comparison operation. All of the match control signals are provided to priority encoder 11. Priority encoder 11 determines which one of the asserted match control signals has priority. In response, priority encoder 11 provides a 10-bit output address A[9:0] that corresponds with the asserted match control signal determined to have priority. The output address A[9:0] is provided to the I/O circuitry (not shown).

FIG. 3 is a block diagram of a 1 Mbit CAM system 100 that includes sixteen CAM arrays 101–116 identical to CAM array 10 (FIG. 2). Each of the sixteen CAM arrays 101–116 receives the input data signal D[63:0] and simultaneously generates the appropriate match control signals. Priority encoder 120 receives the match control signals from all of the CAM arrays 101–116. In response, priority encoder 120 generates a 14-bit output address A[13:0].

CAM system 100 consumes a significant amount of power. In general, CAM arrays 101–116 consume about 2.5 Watts. Priority encoder 120 also typically consumes about 2.5 Watts. The I/O circuitry associated with CAM system 100 consumes about 1 Watt. This is a significant amount of power to be consumed by a memory system. Consequently, CAM arrays are typically limited to smaller capacities than 1 Mbit (e.g., 1 Kbit).

It would therefore be desirable to have a CAM system having a relatively large capacity, but which consumes less power than a conventional CAM system having the same capacity.

SUMMARY

Accordingly, the present invention provides a CAM system that includes a plurality of CAM arrays that are assigned different priority levels. Each CAM array generates a plurality of match control signals, wherein each of the CAM arrays asserts a match control signal for each detected match. The CAM system also includes a plurality of latch circuits, each being coupled to receive the match control signals from a corresponding CAM array. In one embodiment, there are four latch circuits coupled to receive the match control signals provided by four corresponding CAM arrays.

A latch control circuit is also coupled to receive the match control signals from the CAM arrays. In response, the latch control circuit causes one and only one of the latch circuits to latch the match control signals received from the corresponding CAM array. The latch circuit that latches the match control signals is the latch circuit corresponding with the highest priority CAM array to assert a match control signal. In one embodiment, the latch circuit is controlled by a latch enable signal. Power savings are realized because only one latch enable signal is asserted for any compare operation. Further power savings are realized because only one of the latch circuits switches its stored match control signals during a compare operation.

In a particular embodiment, the latch control circuit includes a plurality of match detector circuits and a plurality of hit logic circuits. Each of the match detector circuits is coupled to receive the match control signals from a corresponding CAM array. If any of the match control signals received by a match detector circuit is asserted, then the match detector circuit asserts a corresponding hit signal. Each hit signal has a priority corresponding with the priority of the CAM array providing the match control signals.

Each of the hit logic circuits is coupled to receive a hit signal from a corresponding match detector circuit, as well as all other hit signals having a higher priority. The hit logic circuit that receives the highest priority asserted hit signal from its corresponding match detector circuit asserts a corresponding latch enable signal, which causes one and only one latch circuit to latch the match control signals received from the corresponding CAM array. All other hit logic circuits de-assert their corresponding latch enable signals, thereby disabling their corresponding latch circuits.

The CAM system also includes plurality of priority encoders, each being coupled a corresponding latch circuit. The priority encoders generate a corresponding intermediate priority address in response to match control signals stored in the corresponding latch circuit. Because only one of the latch circuits stores a new set of match control signals during any compare operation, only one priority encoder will provide a different intermediate priority address during any given compare operation. This results in further power savings within the CAM system.

In another embodiment, each of the hit logic circuits include a latch for storing the hit signal received from the corresponding match detector circuit as a latched hit signal. The latched hit signals are subsequently used to route an output address of the compare operation from the CAM system. By latching the hit signals, it is not necessary for the hit signals to be asserted for the entire duration of the compare operation.

An output logic circuit is coupled to receive the intermediate priority addresses and the latched hit signals. The output logic circuit generates an output priority address in response to the intermediate priority addresses and the latched hit signals.

The present invention also includes a method of operating a CAM system, wherein a compare operation comprises (1) generating a plurality of match control signals with a plurality of CAM arrays having different priority levels, (2) generating a plurality of hit signals, wherein each hit signal corresponds with one of the CAM arrays, and each hit signal is asserted if the corresponding CAM array asserts at least one match control signal; (3) latching the match control signals generated by one and only one of the CAM arrays, thereby creating a set of latched match control signals; and (4) encoding the set of latched match control signals to generate a first portion of a priority address. The method can further include (5) generating a second portion of the priority address in response to the hit signals, wherein the second portion of the priority address identifies one of the CAM arrays.

The present invention will be more fully understood in view of the following description and drawings.

DETAILED DESCRIPTION

Figure 1:
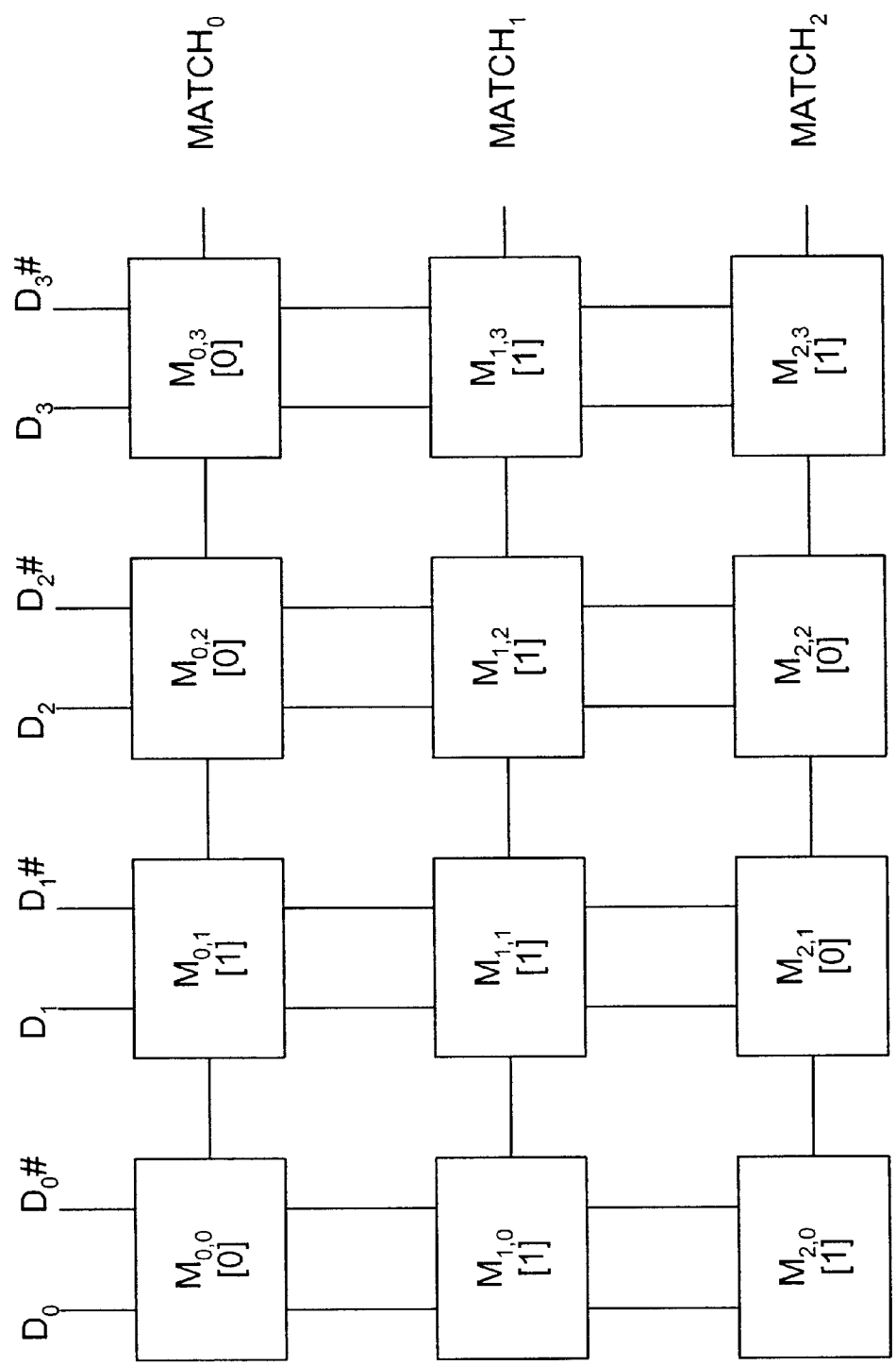
FIG. 1 is a block diagram of a conventional array of CAM cells.
Figure 2:
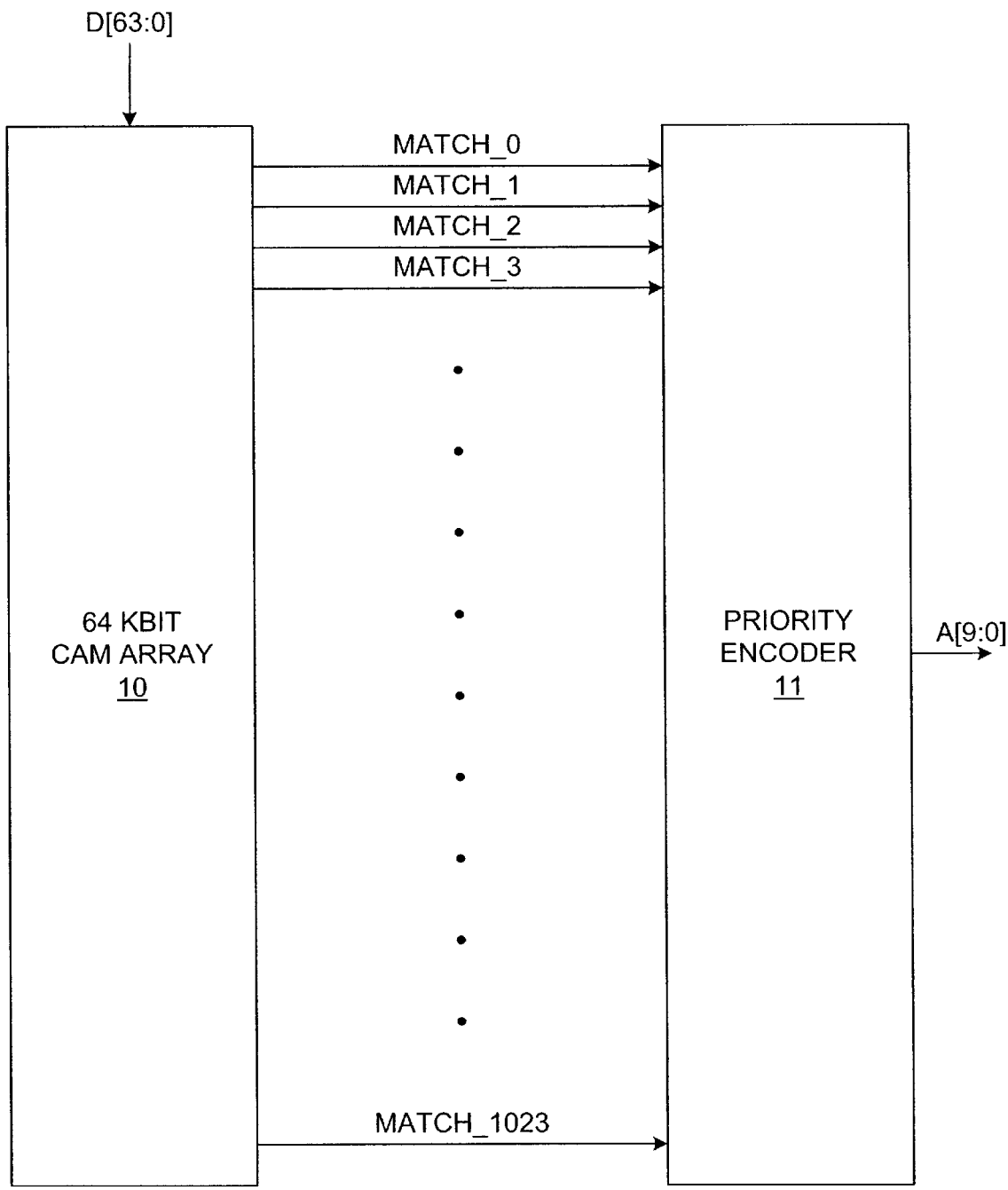
FIG. 2 is a block diagram of a conventional 64-Kbit CAM system.
Figure 3:
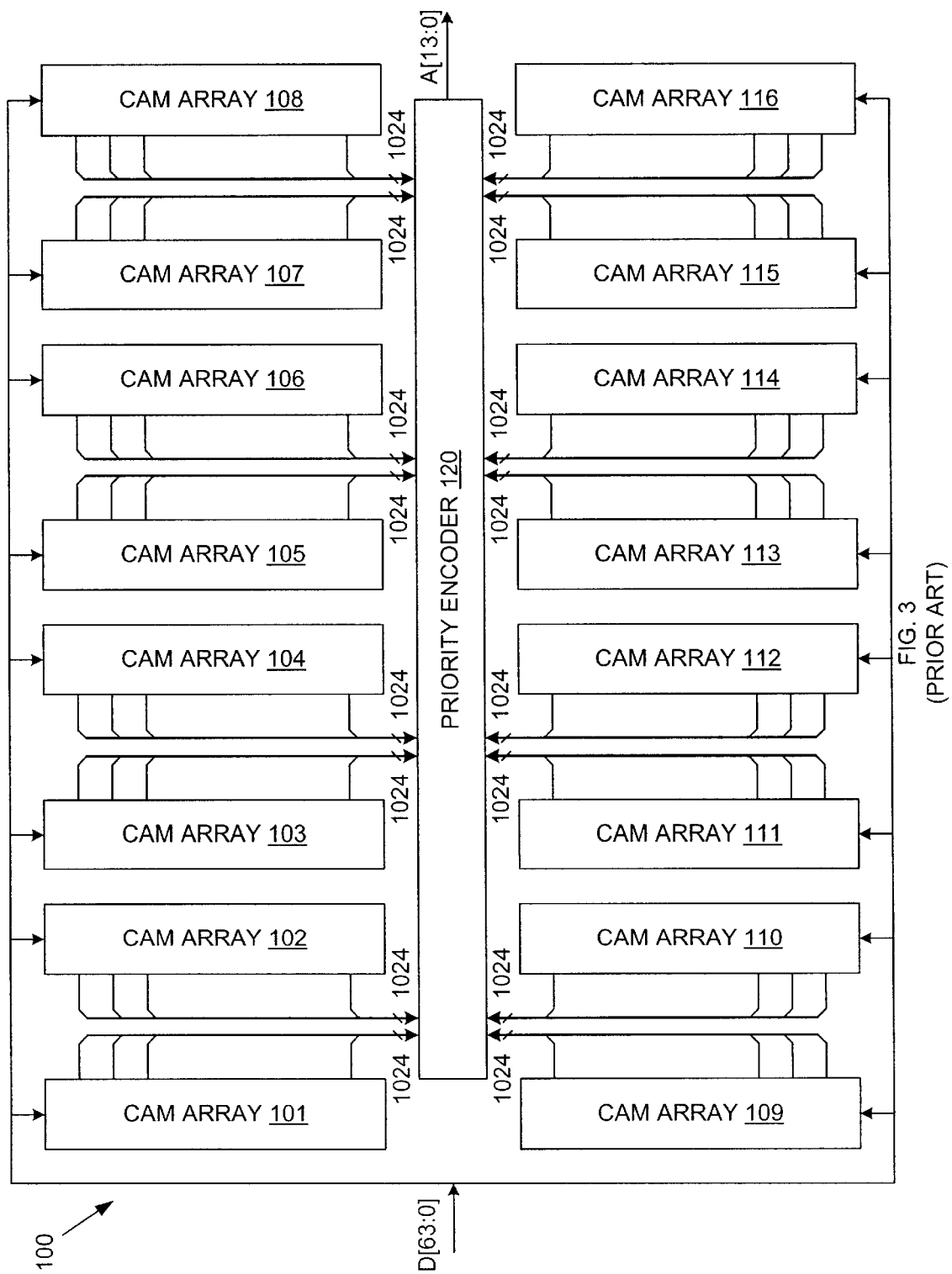
FIG. 3 is a block diagram of a conventional 1-Mbit CAM system.
Figure 4:
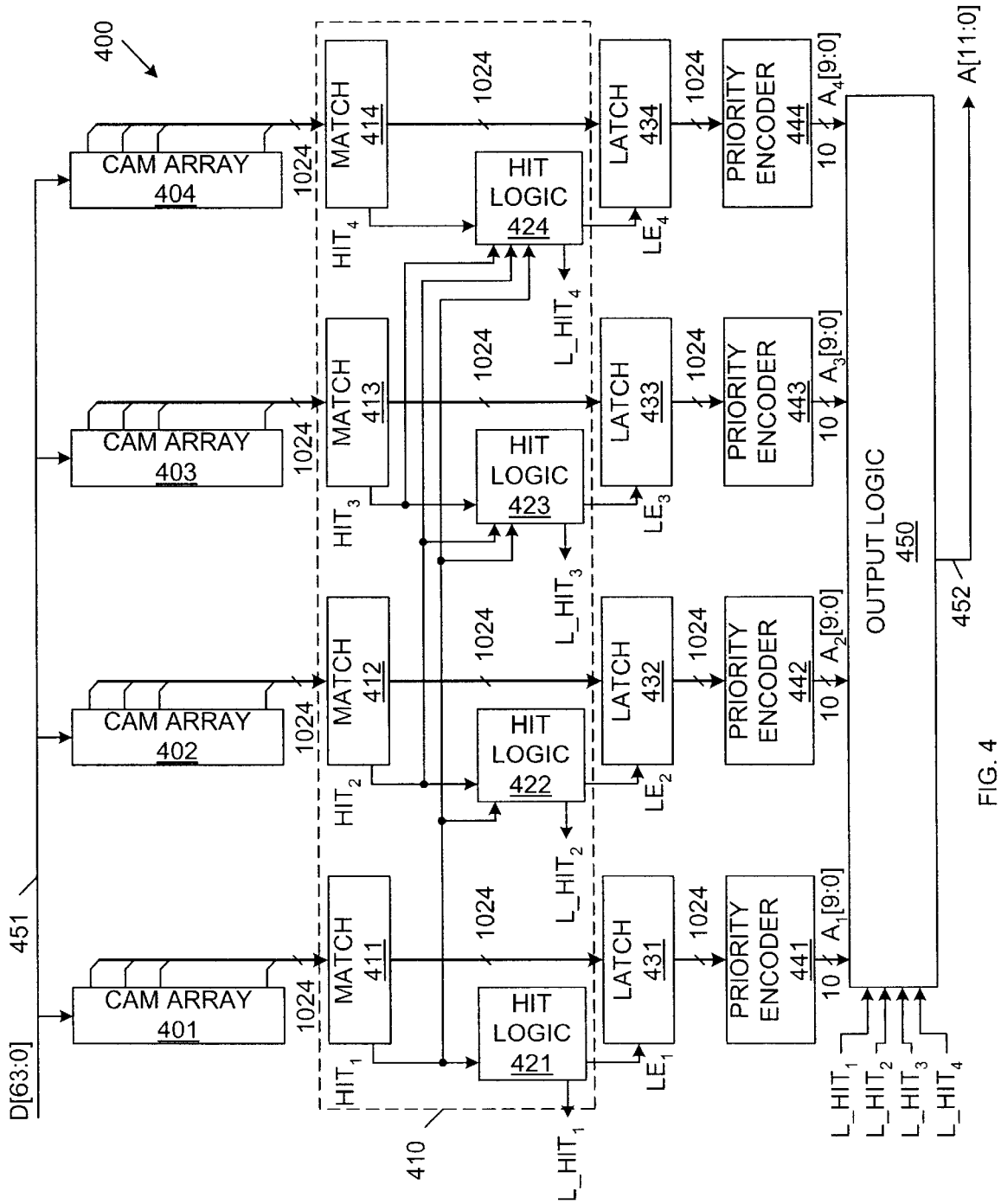
FIG. 4 is a block diagram of a 256-Kbit CAM system in accordance with one embodiment of the present invention.

FIG. 4 is a block diagram of a 1-Mbit CAM system 400 in accordance with one embodiment of the present invention. CAM system 400 includes four CAM arrays 401–404. Each of these CAM arrays 401–404 is identical to conventional CAM array 10. Thus, each of CAM arrays 401–404 has 64 columns and 1024 rows of CAM cells. CAM system 400 therefore has a capacity of 256 Kbits. It is noted that the present invention is not limited to a CAM system having a particular capacity. Similarly, the present invention is not limited to a CAM system having a particular number of CAM arrays, or to a CAM system using CAM arrays having particular row/column dimensions.

During a first memory cycle, an input data value D[63:0] is transmitted to CAM arrays 401–404 on input bus 451. Each of CAM arrays 401–404 simultaneously performs a comparison operation, wherein each row in CAM arrays 401–404 compares its contents with the input data value D[63:0]. If a match is detected in any of the rows, the associated CAM array asserts a logic high corresponding match control signal. More specifically, if a match is detected in row N of CAM array M, then CAM array M asserts match control signal MATCH_N, where N is an integer between 1 and 1024 and M is an integer between 401 and 404. More than one match can be detected during a single comparison operation. For example, during one comparison operation, two matches might exist in CAM array 401, one match might exist in CAM array 403, and seven matches might exist in CAM array 404.

CAM arrays 401–404 are designated to have different priorities. CAM array 401 has the highest priority, followed in order of descending priority by CAM arrays 402, 403 and 404 (i.e., CAM array 404 has the lowest priority). Thus, every match control signal generated by CAM array 401 has a higher priority than any match control signal generated by CAM arrays 402–404.

CAM system 400 further includes latch control circuit 410, latches 431–434, priority encoders 441–444, output logic 450 and output bus 452. Latch control circuit 410 includes match detectors 411–414 and hit logic blocks 421–424. Match detectors 411–414 are coupled to receive the match control signals generated by CAM arrays 401–404, respectively.

Figure 5:
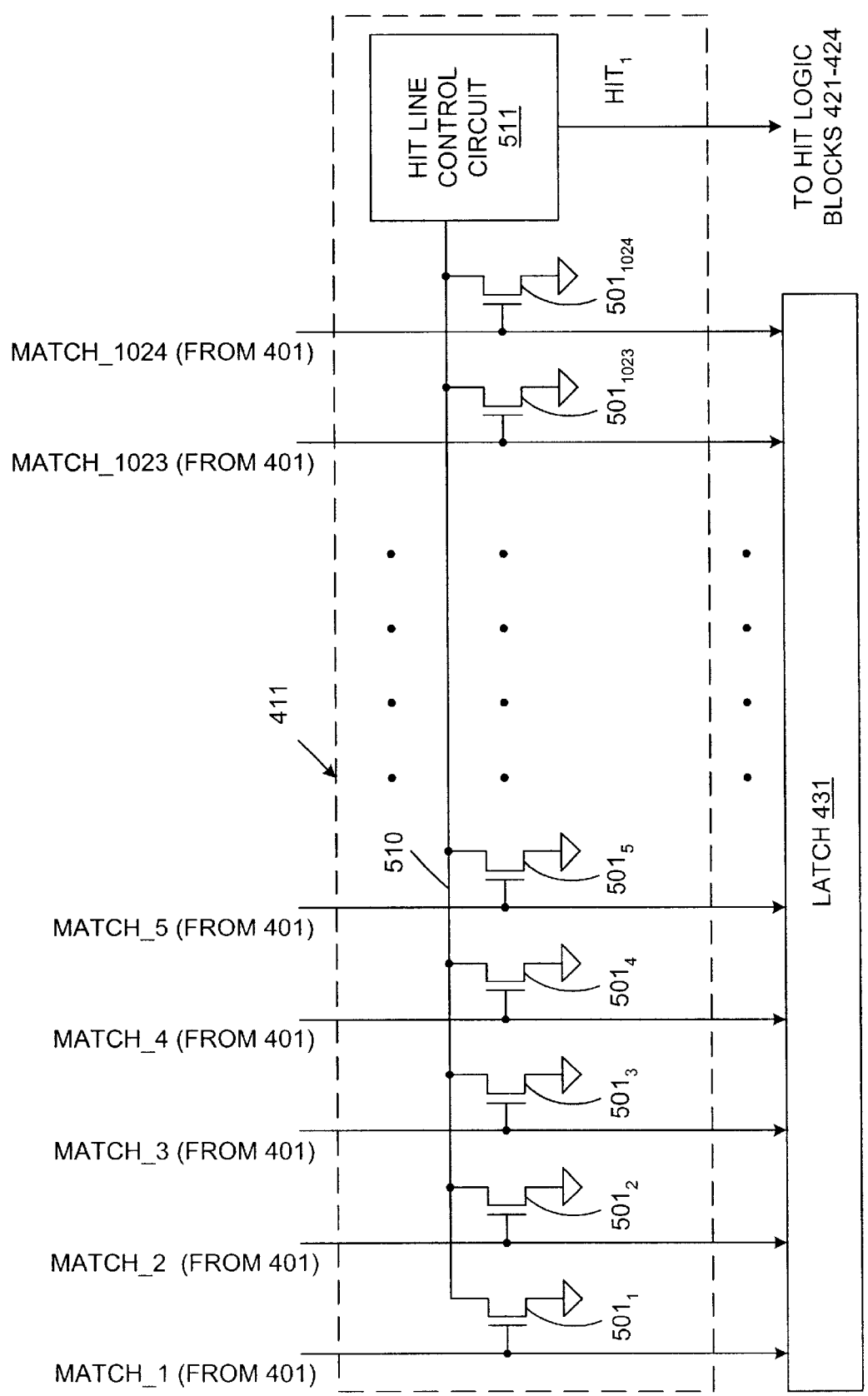
FIG. 5 is a schematic diagram illustrating a match detector in accordance with one embodiment of the present invention.

FIG. 5 is a schematic diagram illustrating match detector 411 in accordance with one embodiment of the present invention. Match detectors 412–414 are identical to match detector 411. Match detector 411 includes hit line 510, hit line control circuit 511, and a plurality of n-channel pass transistors $501_1$–$501_{1024}$, which are coupled to receive the match control signals from CAM array 401. Only pass transistors $501_1$–$501_5$ and $501_{1023}$–$501_{1024}$ are illustrated in FIG. 5 for purposes of clarity.

Each pass transistor in first match detector 411 is coupled in series between hit line 510 and a ground supply terminal. The gate of each pass transistor is coupled to receive a corresponding match control signal from a corresponding row of CAM cells. For example, the gate of pass transistor $501_4$ is coupled to receive match control signal MATCH_4 from row 4 of CAM array 401.

At the beginning of each memory cycle, hit line control circuit 511 pre-charges hit line 510 to a logic high voltage. If at least one of the match control signals provided by CAM array 401 is asserted high, then an associated one of the pass transistors in first match detector 411 is turned on, thereby pulling down hit line 510 to a logic low value. Hit line control circuit 511 monitors the voltage on hit line 510. If the voltage on hit line 510 is pulled down to a logic low value, then hit line control circuit 511 asserts a logic high hit signal $HIT_1$. A logic high hit signal $HIT_1$ therefore indicates the presence of at least one match in the first CAM array 401.

If none of the match control signals provided by the first CAM array 401 is asserted high (i.e., no match is detected), then none of the pass transistors in match detector 411 is turned on. As a result, hit line 510 maintains its logic high state. Upon detecting the logic high state on hit line 510, hit line control circuit 511 de-asserts the hit control signal $HIT_1$ low. A logic low hit control signal $HIT_1$ therefore indicates the absence of any matches in the first CAM array 401. Match detectors 412–414 generate the $HIT_2$–$HIT_4$ signals, respectively, in response to the match signals provided by CAM arrays 402–404, respectively, in the same manner that match detector 411 generates the $HIT_1$ control signal.

The configuration of match detectors 411–414 also enables these match detectors to pass the match control signals to latches 431–434, respectively.

The $HIT_1$–$HIT_4$ control signals are provided to hit logic blocks 421–424, respectively. In addition, each of the $HIT_1$–$HIT_3$ signals is provided to the lower priority hit logic blocks. Thus, the $HIT_1$ signal is provided to lower priority hit logic blocks 422–424, the $HIT_2$ signal is provided to lower priority hit logic blocks 423–424, and the $HIT_3$ signal is provided to hit logic block 424.

Each of the hit logic blocks 421–424 provides a latch enable signal and a latched hit signal in response to the received hit signals. More specifically, hit logic blocks 421–424 provide respective latch enable signals $LE_1$–$LE_4$ to respective latches 431–434. Hit logic blocks 421–424 further provide respective latched hit signals $L\_HIT_1$–$L\_HIT_4$ to output logic circuit 450.

In general, only one of the hit logic blocks 421–424 will assert the latch enable signal required to enable the corresponding latch during a particular compare operation. More specifically, the highest priority hit logic block detecting that its corresponding HIT signal is asserted will enable its corresponding latch. For example, if the $HIT_1$ signal is asserted, hit logic block 421 asserts the $LE_1$ signal, thereby enabling the corresponding latch 431. Meanwhile, hit logic blocks 422–424 de-assert the $LE_2$–$LE_4$ signals, thereby preventing latches 432–434 from storing the corresponding match control signals, regardless of the status of the $HIT_2$–$HIT_4$ signals.

In another example, if the $HIT_3$ signal is asserted, and the $HIT_1$ and $HIT_2$ signals are not asserted, then the $HIT_3$ signal is the highest priority hit signal asserted. As a result, hit logic block 423 asserts the $LE_3$ latch enable signal, thereby enabling the corresponding latch 433. Meanwhile, hit logic blocks 421–422 and 424 de-assert the $LE_1$–$LE_2$ and $LE_4$ signals, thereby disabling latches 431–432 and 434, regardless of the status of the $HIT_4$ signal.

Figure 6:
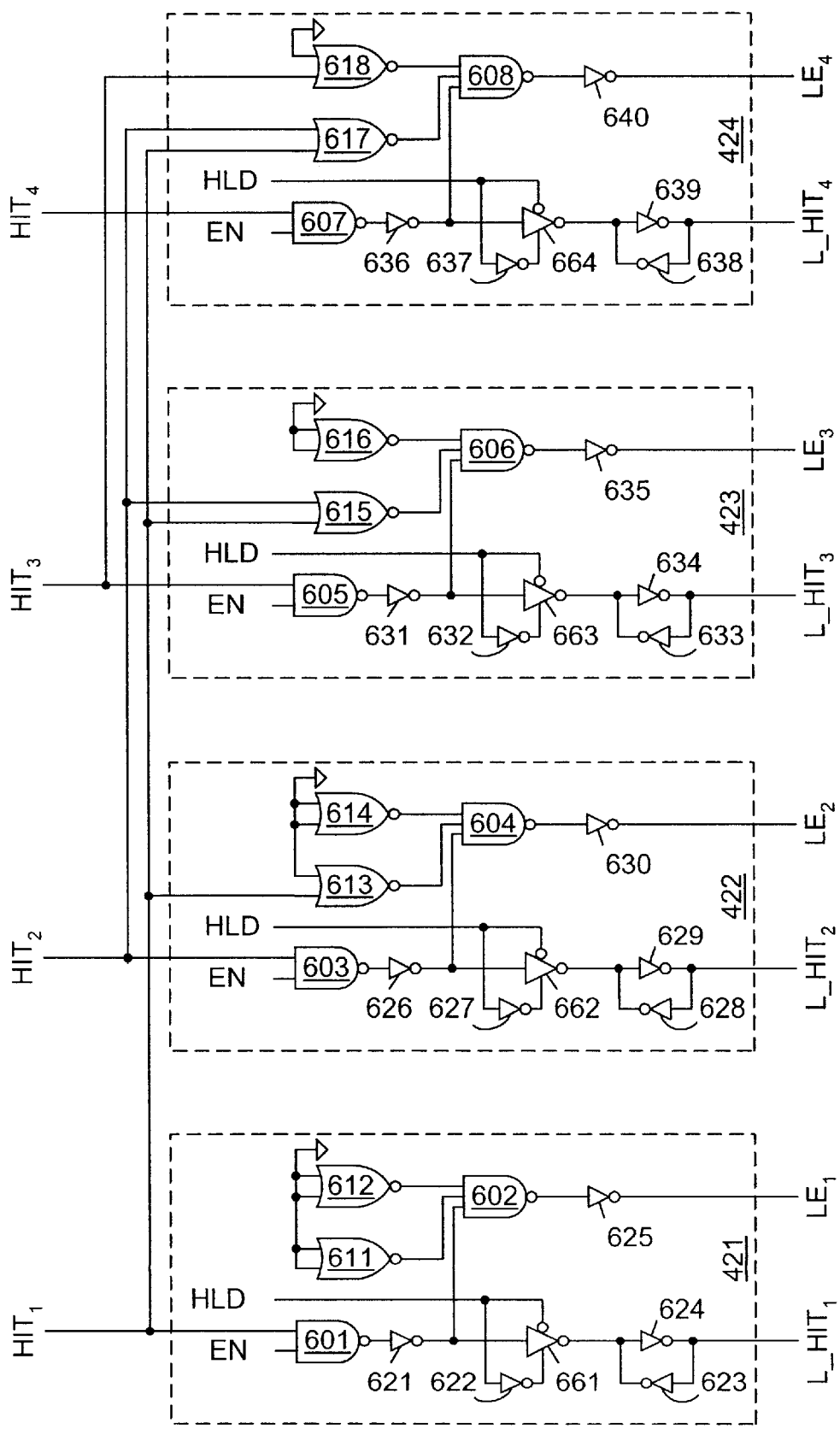
FIG. 6 is a schematic diagram illustrating hit logic blocks in accordance with one embodiment of the present invention.

FIG. 6 is a circuit diagram illustrating hit logic circuits 421–424 in accordance with one embodiment of the present invention. Hit logic circuits 421–424 include NAND gates 601–608, NOR gates 611–618, inverters 621–640 and tri-state buffers 661–664. Each of hit logic circuits 421–424 has a similar configuration, as illustrated in FIG. 6.

An internal enable signal EN is applied to an input terminal of each of NAND gates 601, 603, 605 and 607. When de-asserted low, the EN signal causes NAND gates 601, 603, 605 and 607 to provide logic high output signals, which in turn, cause latch enable signals $LE_1$–$LE_4$ to be de-asserted low. When asserted high, the EN signal causes NAND gates 601, 603, 605 and 607 to provide output signals equal to the inverse of the $HIT_1$, $HIT_2$, $HIT_3$ and $HIT_4$ signals, respectively.

An internal hold signal HLD is applied to enable terminals of tri-state buffers 661–664. More specifically, the HLD signal is applied to inverting enable terminals of tri-state buffers 661–664, and the inverse of the HLD signal (as inverted by inverters 622, 627, 632 and 637) is applied to non-inverting enable terminals of tri-state buffers 661–664. When asserted high, the HLD signal causes tri-state buffers 661 to provide a high impedance output (i.e., a floating or tri-state output). At this time, values are stored in the latches formed by cross-coupled inverter pairs 623–624, 628–629, 633–634 and 638–639. That is, the values of $L\_HIT_1$–$L\_HIT_4$ are held (latched). When de-asserted low, the HLD signal enables tri-state buffers 661–664, thereby enabling the output signals provided by inverters 621, 626, 631 and 636 to be driven through tri-state buffers 661–664, respectively.

Within hit logic circuit 421, all of the inputs to NOR gates 611–612 are grounded. As a result, NOR gates 611–612 provide logic high signals to NAND gate 602.

Within hit logic circuit 422, both of the inputs to NOR gate 614 and one of the inputs to NOR gate 613 are grounded. The $HIT_1$ signal is provided to the other input terminal of NOR gate 613. As a result, NOR gate 614 provides a logic high signal to NAND gate 604, and NOR gate 613 provides the inverse of the $HIT_1$ signal to NAND gate 604.

Within hit logic circuit 423, both of the inputs to NOR gate 616 are grounded, such that NOR gate 616 provides a logic high signal to NAND gate 606. The $HIT_1$ and $HIT_2$ signals are provided to the input terminals of NOR gate 615. As a result, NOR gate 615 will provide a logic high signal to NAND gate 606 when both the $HIT_1$ and $HIT_2$ signals have logic low states.

Finally, within hit logic circuit 424, one of the inputs to NOR gate 618 is grounded, and the other input to NOR gate 618 is coupled to receive the $HIT_3$ signal. As a result, NOR gate 618 provides the inverse of the $HIT_3$ signal to NAND gate 608. The $HIT_1$ and $HIT_2$ signals are provided to the input terminals of NOR gate 617. As a result, NOR gate 617 will only provide a logic high signal to NAND gate 608 when both the $HIT_1$ and $HIT_2$ signals have logic low states.

Hit logic blocks 411–414 operate as follows. At the beginning of the compare cycle, the enable signal EN is de-asserted low, such that the latch enable signals $LE_1$–$LE_4$ are de-asserted low. Under these conditions, latches 431–434 continue to store any values stored during the previous compare cycle, and do not latch in any new values. Also at the beginning of the compare cycle, the hold signal HLD is asserted high, such that the output terminals of tri-state buffers 661–665 are floating, and the latches formed by inverter pairs 623–624, 628–629, 633–634 and 638–639 continue to store any previously stored values.

After the $HIT_1$–$HIT_4$ signals have been developed (i.e., after the $HIT_1$ signal has had time to propagate to NOR gate 617) the enable signal EN is asserted high, and the hold signal HLD is de-asserted low. In response to the asserted enable signal EN, NAND gates 601, 603, 605 and 607 provide output signals equal to the inverse of the $HIT_1$, $HIT_2$, $HIT_3$ and $HIT_4$ signals, respectively. If the $HIT_1$ signal has a logic high value (i.e., a hit is detected in CAM array 401), then NAND gate 601 provides a logic low value to inverter 621. In response, inverter 621 provides a logic high value to NAND gate 602. Because all of the inputs to NAND gate 602 are logic high signals, NAND gate 602 provides a logic low output signal. In response, inverter 625 asserts a logic high latch enable signal $LE_1$. As a result, the match control signals provided by match detector 411 are latched into latch 431 (FIG. 4).

In this example, the logic high $HIT_1$ signal is further provided to NOR gates 613, 615 and 617 in hit logic blocks 422–424, thereby causing these NOR gates to provide logic low output signals to NAND gates 604, 606 and 608. As a result, these NAND gates provide logic high output signals. In response, inverters 630, 635 and 640 provide logic low latch enable signals $LE_2$, $LE_3$ and $LE_4$, respectively. Consequently, the match control signals provided by match detector circuits 412–414 are not latched into latches 432–434 (FIG. 4).

The de-asserted hold signal HLD enables tri-state buffers 661–664, thereby causing these buffers 661–664 to drive output signals equal to the inverted $HIT_1$–$HIT_1$ signals, respectively. The signals driven by buffers 661–664 are inverted by inverters 624, 629, 634 and 639, respectively, such that the latched hit signals $L\_HIT_1$–$L\_HIT_4$ have the same values as the $HIT_1$–$HIT_4$ signals, respectively. After the $L\_HIT_1$–$L\_HIT_4$ signals for the current compare cycle have been developed, the hold signal HLD is asserted high, thereby disabling tri-state buffers 661–664. At this time, the $L\_HIT_1$–$L\_HIT_4$ signals for the current compare cycle are latched by inverter pairs 623–624, 628–629, 633–634 and 638–639, respectively. The hold signal HLD remains asserted high until the next compare cycle.

Table 1 below summarizes the values of the $PE_1$–$PE_4$ and $L\_HIT_1$–$L\_HIT_4$ signals for the various values of the $HIT_1$–$HIT_4$ signals.

TABLE 1

| $HIT_1$–$HIT_4$ | $LE_1$ | $LE_2$ | $LE_3$ | $LE_4$ | $L\_HIT_1$ | $L\_HIT_2$ | $L\_HIT_3$ | $L\_HIT_4$ |
|---|---|---|---|---|---|---|---|---|
| 1xxx | 1 | 0 | 0 | 0 | 1 | $HIT_2$ | $HIT_3$ | $HIT_4$ |
| 01xx | 0 | 1 | 0 | 0 | 0 | 1 | $HIT_3$ | $HIT_4$ |
| 001x | 0 | 0 | 1 | 0 | 0 | 0 | 1 | $HIT_4$ |
| 0001 | 0 | 0 | 0 | 1 | 0 | 0 | 0 | 1 |
| 0000 | 0 | 0 | 0 | 0 | 0 | 0 | 0 | 0 |

Power savings are realized in CAM system 400 because, at most, only one of the latch enable signals $LE_1$–$LE_4$ is asserted during a compare cycle. Further power savings are realized because the contents of the three disabled latches are prevented from changing states during the compare cycle.

Note that if none of the $HIT_1$–$HIT_4$ signals is asserted, then none of the latch enable signals $LE_1$—$LE_4$ or latched hit signals $L\_HIT_1$–$L\_HIT_4$ are asserted.

Priority encoders 441–444 receive the match control signals stored in latches 431–434, and in response, determine which one of the asserted match control signals stored in these respective latches has the highest priority. Priority encoders 441–444 then generate addresses $A_1[9:0]$, $A_2[9:0]$, $A_3[9:0]$ and $A_4[9:0]$, respectively, which are representative of these highest priority match control signals. Priority encoders 441–444 are conventional elements that are known to those skilled in the art.

Because only one of the latch enable signals LE1–LE4 is asserted during a compare operation, only one of latches 431–434 stores a new set of match control signals during each compare operation. Consequently, three of latches 431–434 will store the same set of match control signals during consecutive compare operations. As a result, the results of the three corresponding priority encoders will not change during consecutive compare operations. Additional power savings are realized because three of priority encoders 441–444 do not change any output signals during consecutive compare operations.

Figure 7:
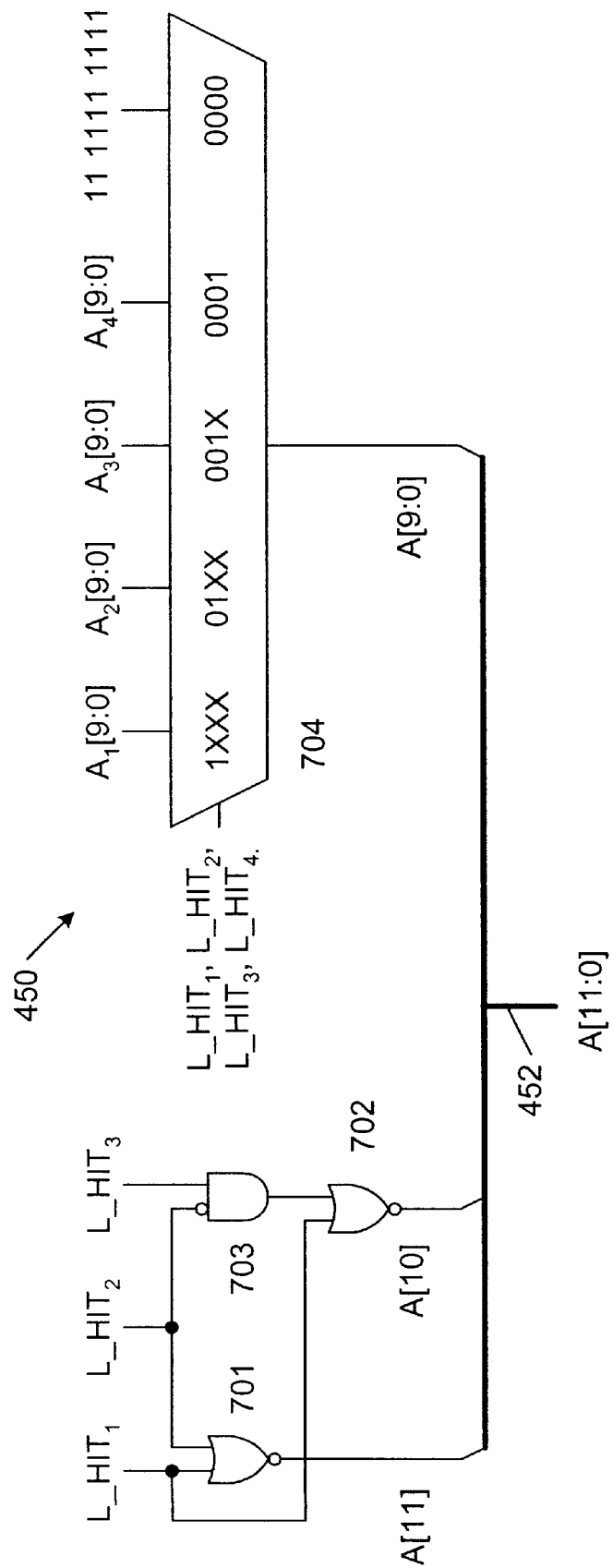
FIG. 7 is a schematic diagram illustrating an output logic block in accordance with one embodiment of the present invention.

FIG. 7 is a circuit diagram illustrating output logic circuit 450. Output logic circuit 450 includes NOR gates 701–702, AND gate 703 and multiplexer 704. Addresses $A_1[9:0]$, $A_2[9:0]$, $A_3[9:0]$ and $A_4[9:0]$ are provided to input terminals of multiplexer 704. A 10-bit signal having all logic "1" values is also provided to an input terminal of multiplexer 704. The latched hit signals $L\_HIT_1$–$L\_HIT_4$ are provided to control terminals of multiplexer 704.

If the $L\_HIT_1$ signal is asserted high (i.e., $L\_HIT_1$–$L\_HIT_4$=1xxx), then multiplexer 704 will route the $A_1[9:0]$ address from priority encoder 441 as the output address bits $A[9:0]$.

If the $L\_HIT_1$ signal is de-asserted low, and the $L\_HIT_2$ signal is asserted high (i.e., $L\_HIT_1$–$L\_HIT_4$=01xx), then multiplexer 704 will route the $A_2[9:0]$ address from priority encoder 442 as the output address bits $A[9:0]$.

If the $L\_HIT_1$ and $L\_HIT_2$ signals are de-asserted low, and the $L\_HIT_3$ signal is asserted high (i.e., $L\_HIT_1$–$L\_HIT_4$=001x), then multiplexer 704 will route the $A_3[9:0]$ address from priority encoder 443 as the output address bits $A[9:0]$.

If the $L\_HIT_1$–$L\_HIT_3$ signals are de-asserted low, and the $L\_HIT_4$ signal is asserted high (i.e., $L\_HIT_1$–$L\_HIT_4$=0001), then multiplexer 704 will route the $A_4[9:0]$ address from priority encoder 444 as the output address bits $A[9:0]$.

Finally, if all of the $L\_HIT_1$–$L\_HIT_4$ signals are de-asserted low (i.e., $L\_HIT_1$–$L\_HIT_4$=0000), then multiplexer 704 will route the 10-bit logic high signal as the output address bits $A[9:0]$.

In this manner, the 10-bit address associated with the asserted hit signal having the highest priority is provided as an output address signal.

NOR gates 701–702 and AND gate 703 generate the two most significant bits (i.e., $A[11:10]$) of the output address signal $A[11:0]$. These most significant bits $A[11:10]$ indicate which CAM array (if any) is associated with the output address bits $A[9:0]$ provided by multiplexer 704. The input terminals of NOR gate 701 are coupled to receive the $L\_HIT_1$ and $L\_HIT_2$ signals. The output terminal of NOR gate 701 provides the $A[11]$ output address bit.

The inverting input terminal of AND gate 703 is coupled to receive the $L\_HIT_2$ signal, and the non-inverting input terminal of AND gate 703 is coupled to receive the $L\_HIT_3$ signal. The input terminals of NOR gate 702 are coupled to receive the $L\_HIT_1$ signal and the output signal provided by AND gate 703. The output terminal of NOR gate 702 provides the $A[10]$ output address bit.

Table 2 below summarizes the values of the output address bits $A[11:10]$ for the various values of the $L\_HIT_1$–$L\_HIT_3$ signals. In Table 2, an 'X' represents a "don't care" value.

TABLE 2

| L_HIT1 | L_HIT2 | L_HIT3 | L_HIT4 | A [11] | A [10] |
|---|---|---|---|---|---|
| 1 | X | X | X | 0 | 0 |
| 0 | 1 | X | X | 0 | 1 |
| 0 | 0 | 1 | X | 1 | 0 |
| 0 | 0 | 0 | 1 | 1 | 1 |
| 0 | 0 | 0 | 0 | 1 | 1 |

Thus, the A[11:10] signals have a value of "00" if the $L\_HIT_1$ signal is the highest priority asserted hit signal; a value of "01" if the $L\_HIT_2$ signal is the highest priority asserted hit signal; a value of "10" if the $L\_HIT_3$ signal is the highest priority asserted hit signal; and a value of "11" if the $L\_HIT_4$ signal is the highest priority asserted hit signal, or none of the $L\_HIT_1$–$L\_HIT_4$ signals is asserted.

After the output address A[11:0] is provided, the comparison operation is complete. Subsequent comparison operations are performed in a similar manner.

Although the present invention has been described in connection with several embodiments, it is understood that this invention is not limited to the embodiments disclosed, but is capable of various modifications which would be apparent to one of ordinary skill in the art. Thus, the invention is limited only by the following claims.

What is claimed is:

1. A content addressable memory (CAM) system comprising:
    a plurality of CAM arrays having different priority levels, including higher priority levels and lower priority levels, each CAM array generating a plurality of match control signals, wherein each of the CAM arrays asserts a match control signal for each detected match;
    a plurality of latch circuits, each being coupled to receive the match control signals from a corresponding CAM array; and
    a latch control circuit coupled to receive the match control signals from the CAM arrays, and in response, causes one and only one of the latch circuits to latch the match control signals received from the corresponding CAM array, wherein the one and only one of the latch circuits corresponds with the highest priority CAM array to assert a match control signal.

2. The CAM system of claim 1, wherein the latch control circuit comprises:
    a plurality of match detector circuits, each being coupled to receive the match control signals from a corresponding CAM array, and each asserting a hit signal if any of the received match control signals are asserted, wherein each asserted hit signal has a priority corresponding with the priority of the corresponding CAM array; and
    a plurality of hit logic circuits, each being coupled to receive a hit signal from a corresponding match detector circuit, as well as all other hit signals having a higher priority, wherein the hit logic circuit receiving the highest priority asserted hit signal from the corresponding match detector circuit causes the one and only one latch circuit to latch the match control signals received from the corresponding CAM array.

3. The CAM system of claim 2, wherein the hit logic circuit receiving the highest priority asserted hit signal from a corresponding match detector circuit is configured to assert a latch enable signal which causes the one and only one latch circuit to latch the match control signals.

4. The CAM system of claim 2, wherein each of the hit logic circuits comprise a latch for storing the hit signal received from the corresponding match detector circuit as a latched hit signal.

5. The CAM system of claim 4, further comprising a plurality of priority encoders, each being coupled a corresponding latch circuit, and each being configured to generate a corresponding intermediate priority address in response to match control signals stored in the corresponding latch circuit.

6. The CAM system of claim 5, wherein each of the hit logic circuits comprise a latch for storing the hit signal received from the corresponding match detector circuit as a latched hit signal.

7. The CAM system of claim 6, further comprising an output logic circuit coupled to receive the intermediate priority addresses and the latched hit signals, the output logic circuit being configured to generate an output priority address in response to the intermediate priority addresses and the latched hit signals.

8. The CAM system of claim 7, wherein the output logic circuit comprises a multiplexer which is configured to pass one of the intermediate priority addresses or a predetermined value in response to the latched hit signals.

9. The CAM system of claim 7, wherein the output logic circuit comprises logic configured to generate a portion of the output priority address that identifies one of the CAM arrays in response to the latched hit signals.

10. The CAM system of claim 1, further comprising a plurality of priority encoders, each being coupled a corresponding latch circuit, and each being configured to generate a corresponding intermediate priority address in response to match control signals stored in the corresponding latch circuit.

11. A method of operating a content addressable memory (CAM) system, wherein a compare operation comprises:
    generating a plurality of match control signals with a plurality of CAM arrays having different priority levels, wherein a match control signal is asserted for each match condition detected by the CAM arrays;
    generating a plurality of hit signals, wherein each hit signal corresponds with one of the CAM arrays, and each hit signal is asserted if the corresponding CAM array asserts at least one match control signal;
    latching the match control signals generated by one and only one of the CAM arrays, thereby creating a set of latched match control signals; and
    encoding the latched match control signals to generate a first portion of a priority address.

12. The method of claim 11, wherein the compare operation further comprises:
    latching the hit signals, thereby creating a plurality of latched hit signals,
    generating a second portion of the priority address in response to the latched hit signals, the second portion identifying one of the CAM arrays.

13. The method of claim 11, wherein the compare operation further comprises:
    providing a plurality of latch circuits, wherein each of the latch circuits is coupled to receive the match control signals generated by a corresponding CAM array; and
    enabling one and only one of the latch circuits to latch the match control signals generated by the corresponding CAM array, wherein the enabled latch circuit corresponds with a highest priority CAM array asserting a hit signal.

* * * * *